(12) United States Patent
Camera et al.

(10) Patent No.: US 6,381,185 B2
(45) Date of Patent: Apr. 30, 2002

(54) METHOD AND A CIRCUIT ARCHITECTURE FOR TESTING AN INTEGRATED CIRCUIT COMPRISING A PROGRAMMABLE, NON-VOLATILE MEMORY

(75) Inventors: Alessandro Camera, Savona; Paolo Sandri, Milan; Ignazio Bellomo, Ponte Sesto Rozzano; Albino Pidutti, Udine, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/782,969

(22) Filed: Feb. 14, 2001

(30) Foreign Application Priority Data

Feb. 22, 2000 (EP) .............................. 00830124

(51) Int. Cl.$^7$ ................................................. G11C 7/00
(52) U.S. Cl. .................................... 365/201; 365/185.24
(58) Field of Search ............................ 365/201, 185.24

(56) References Cited

U.S. PATENT DOCUMENTS

| | | | |
|---|---|---|---|
| 5,402,370 A | | 3/1995 | Fazio et al. ................. 365/218 |
| 5,625,591 A | | 4/1997 | Kato et al. ............. 365/185.24 |
| 5,675,546 A | * | 10/1997 | Leung ........................ 365/201 |
| 6,243,839 B1 | * | 6/2001 | Roohparvar ................ 365/201 |
| 6,246,617 B1 | * | 6/2001 | Urakawa .................... 365/201 |

FOREIGN PATENT DOCUMENTS

EP      0903753     3/1999     .......... G11C/29/00

* cited by examiner

*Primary Examiner*—Trong Phan
(74) *Attorney, Agent, or Firm*—Lisa K. Jorgenson; Allen, Dyer, Doppelt, Milbra & Gilchrist, P.A.

(57) ABSTRACT

A method for testing a programmable, nonvolatile memory including a matrix of memory cells is provided. A plurality of memory cells are programmed. The programmed memory cells are addressed in succession to identify a lowest of threshold voltage levels. The addressing for each memory location includes applying a selection voltage that is lower than the lowest threshold voltage level corresponding to a memory location currently being addressed. The bits are read from the programmed memory cells for the memory location currently being addressed. The reading is repeated while progressively changing the selection voltage supplied to the word line corresponding to the memory location currently being addressed until it is detected that at least one of the bits of the memory location currently being addressed has switched from a first logic level corresponding to a reading of a programmed memory cell to a second logic level corresponding to a reading of a non-programmed memory cell. The low threshold voltage level is compared in the memory location currently being addressed as determined in the reading with a stored value corresponding to the lowest of the low threshold voltages of the memory locations previously addressed.

33 Claims, 2 Drawing Sheets

METHOD AND A CIRCUIT ARCHITECTURE FOR TESTING AN INTEGRATED CIRCUIT COMPRISING A PROGRAMMABLE, NON-VOLATILE MEMORY

FIELD OF THE INVENTION

The present invention relates to the field of integrated circuits and, more particularly, to semiconductor memories such as programmable, non-volatile memories which includes EPROMs, EEPROMs and Flash EEPROMs, for example. The present invention addresses the problem of testing a non-volatile semiconductor memory integrated in a dedicated semiconductor chip (stand alone memory), or a memory that is part of a more complex electronic system integrated in a single semiconductor chip (embedded memory).

BACKGROUND OF THE INVENTION

After their manufacture, integrated circuits are subjected to functional tests to ensure that they operate correctly and conform to the specified performance. The types of tests which have to be carried out on the integrated circuits vary based upon the type of circuit. With regard to non-volatile memories in particular, and even more particularly to electrically-programmable non-volatile memories (EPROMs, EEPROMs, Flash EEPROMs), an important check which has to be performed is that of checking their ability to retain the data programmed and thus stored in the memory. This check is necessary to be able to offer a product with a guarantee that it is reliable over time.

Typically, tests of this type are carried out on each integrated memory circuit by suitable test instruments by first programming all of the memory cells so that each cell which, as is known, comprises a MOS transistor with a modifiable threshold voltage that is brought to a high threshold-voltage state. Each cell is then individually accessed to identify the lowest of the threshold voltages of all of the cells. This value is subsequently compared with a new lowest value which is normally different and typically lower. The new lowest value is obtained by making the same measurement after the integrated memory circuit has been subjected to a thermal stress (baking) to simulate ageing of the product.

On the basis of the change in the lowest threshold voltage before and after the thermal stressing, it is possible to establish criteria on the basis of which to discard products which do not ensure the desired performance or, when there are several qualitative categories for the same product, to classify the product in the correct category on the basis of its performance characteristics.

As mentioned, the identification of the lowest threshold voltage of the memory cells before and after the device has been subjected to thermal stress provides for a measurement to be taken by accessing the individual cells, that is, by the so-called direct memory access (DMA) technique. This technique provides for each cell to be individually addressed from external the memory, and for the current absorbed by the cell as its gate voltage increases to be measured by an ammeter. This requires bypassing the cell-reading circuitry integrated in the device.

Clearly, an approach of this type is extremely slow and therefore expensive, since it lengthens the overall production time. This is true in particular for medium-capacity or high-capacity memory devices having a very large number of memory cells, such as those which are available nowadays.

SUMMARY OF THE INVENTION

In view of foregoing background, an object of the present invention is therefore to provide a method of testing an integrated circuit comprising a non-volatile memory, particularly a programmable, non-volatile memory, which does not involve the disadvantages intrinsic in current methods used.

Another object of the present invention is to provide, in particular, a method of checking the retention of the data programmed into the memory, which does not involve the disadvantages of current methods.

Yet another object of the present invention is to provide a circuit architecture for implementing these methods.

According to the present invention, a method for testing a programmable, non-volatile memory comprising a matrix of memory cells is provided. The method preferably comprises programming a plurality of the memory cells, and addressing, in succession, the programmed memory cells to identify a lowest of threshold voltage levels. The addressing for each memory location comprises:

a) applying a selection voltage that is lower than the lowest threshold voltage level to a word line of the matrix of memory cells corresponding to a memory location currently being addressed, b) reading bits from the programmed memory cells of the memory location currently being addressed, c) repeating step b) while progressively changing the selection voltage supplied to the word line corresponding to the memory location currently being addressed until it is detected that at least one of the bits of the memory location currently being addressed has switched from a first logic level corresponding to a reading of a programmed memory cell to a second logic level corresponding to a reading of a non-programmed memory cell, the selection voltage for which the switching is detected being the low threshold voltage level of the threshold voltages of the programmed memory cells in the memory location currently being addressed, d) comparing the low threshold voltage level in the memory location currently being addressed as determined in step c) with a stored value corresponding to the lowest of the low threshold voltages of the memory locations previously addressed, and e) storing the lowest threshold voltage level of the memory location currently being addressed if it is lower than a stored value.

The step b) for reading may be performed using reading circuits connected to the matrix of memory cells, and wherein step c), to detect the switching of at least one of the bits of the memory location currently being addressed, output signals from the reading circuits are supplied to a logic circuit for switching a respective output signal when at least one of the output signals of the reading circuits switches from the first logic level to the second logic level. The logic state of the output signal of the logic circuit is monitored to detect the switching.

Another aspect of the present invention is to provide an integrated circuit comprising a matrix of programmable, non-volatile memory cells, a plurality of word lines connected to the matrix of memory cells, and a plurality of reading circuits for reading, in parallel, memory cells belonging to a memory location currently being addressed.

The integrated circuit preferably includes a logic circuit having inputs for receiving outputs from the plurality of reading circuits. The logic circuit switches its own output when at least one of the outputs from the plurality of reading circuits switches from a first logic level corresponding to a reading of a programmed memory cell to a second logic level corresponding to a non-programmed memory cell.

A first externally accessible terminal is also provided, and an output circuit selectively connects an output of the logic circuit to the first externally accessible terminal for connecting to an external test device. The integrated circuit further comprises a second externally accessible terminal, and wherein the output circuit is activated by setting the integrated circuit in a checking mode by applying to the second externally accessible terminal a voltage having a value outside a range of threshold voltage values that can be applied to the second externally accessible terminal during normal operation of the matrix of memory cells.

BRIEF DESCRIPTION OF THE DRAWINGS

The characteristics and the advantages of the present invention will become clear from the following detailed description of some possible practical embodiments which should be regarded purely as non-limiting examples and are illustrated in the appended drawings, in which.

DETAILED DESCRIPTION OF THE PREFERRED EMBODIMENTS

Figure 1:
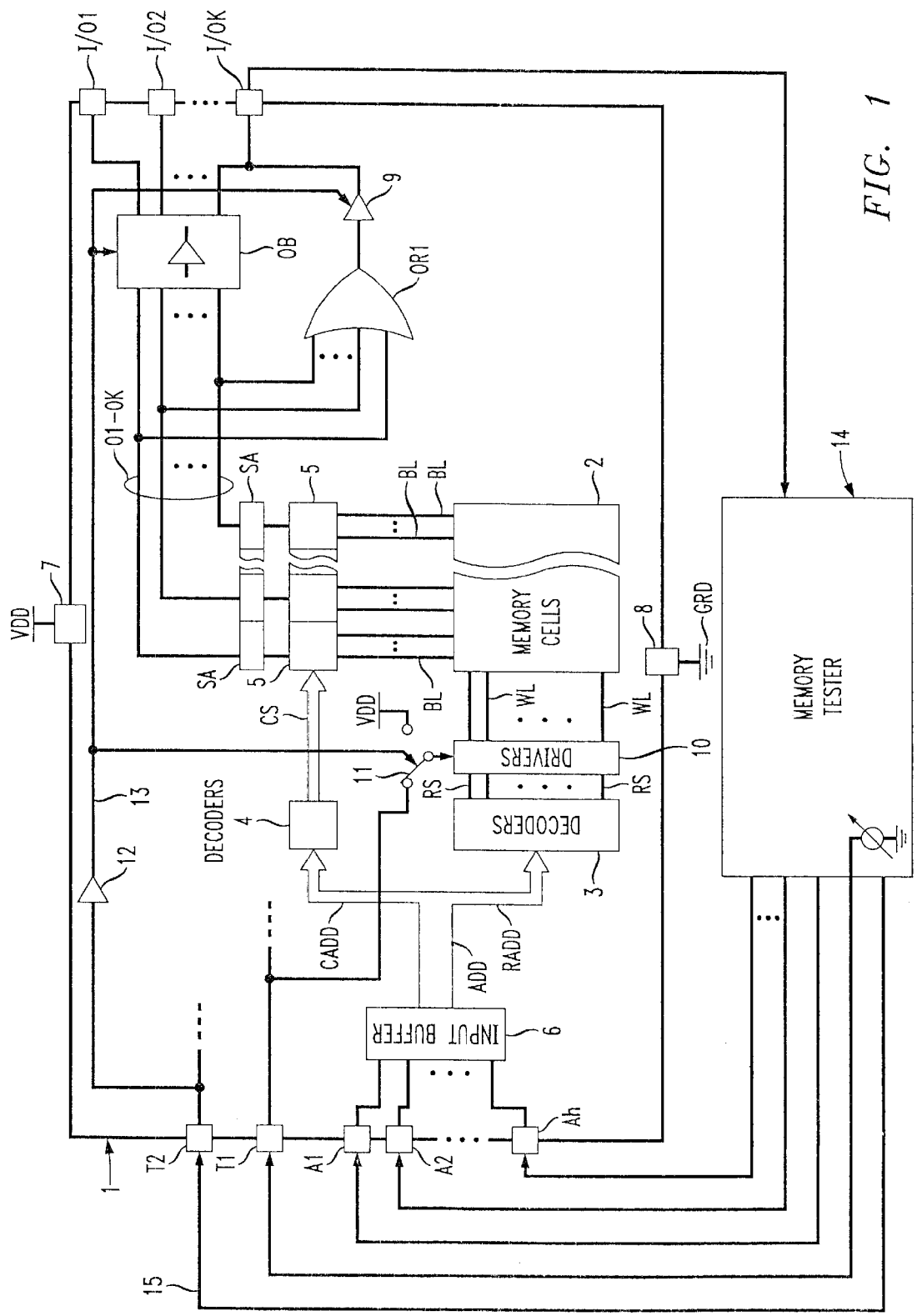
FIG. 1 shows, schematically, a first practical embodiment of the present invention.

With reference to FIG. 1, an integrated memory circuit, particularly a programmable, non-volatile memory such as, for example, an EPROM, an EEPROM, or a Flash EEPROM, is generally indicated by reference 1, and will be referred to below, in short, as the memory 1. In particular, the memory 1 is of the stand alone type, that is, it is integrated independently in a dedicated semiconductor chip. However, this should not be understood as a limitation of the present invention which is equally applicable to an embedded memory, that is, a memory which is part of a more complex electronic system integrated in a single semiconductor chip.

The term terminal is intended to define below an electrical terminal of the integrated circuit which is accessible from external the integrated circuit, that is, from outside the semiconductor chip in which the circuit is integrated, and by means of which the integrated circuit can communicate with the outside environment.

Among the terminals of the memory 1 there are, in particular, a terminal 7 for connection to a voltage supply VDD, and a terminal 8 for connection to a reference voltage such as ground GND. For example, the voltage VDD is 5 volts or 3 volts. Internally, the memory 1 comprises a matrix 2 of memory cells which will also be referred to below as the memory matrix 2. The memory cells are not shown in detail since, naturally, they may be EPROM, EEPROM or Flash EEPROM cells, as the case may be.

The memory 1 has externally accessible terminals A1–Ah, by means of which signals for addressing the respective memory locations can be supplied to the memory from outside. The terminals A1–Ah are connected to respective input buffers, generally indicated by reference 6, at the outputs of which a bus ADD for addressing signals within the memory is provided. The memory matrix 2 is arranged, in a known manner, in $2^m$ rows or word lines WL and $2^n$ columns or bit lines BL.

A line decoding circuit 3 receives m digital line addressing signals (generally indicated RADD) from the bus ADD, decodes them and, according to the particular binary code carried by the line addressing signals RADD, activates one of $2^m$ line selection signals RS to select a corresponding line WL of the $2^m$ lines of the memory matrix 2. Each line selection signal RS controls a respective line WL of the memory matrix 2 by a respective driver circuit. In FIG. 1, the $2^m$ driver circuits are shown as a single block 10.

A column decoding circuit 4 receives n digital column addressing signals (generally indicated CADD) from the bus ADD, decodes them and, according to the particular binary code carried by the column addressing signals CADD, activates one of a set of column selection signals CS. It should be noted that the example shown in FIG. 1 relates to a memory 1 with a parallel output width of k, that is, a memory which can supply a digital output code or word of k bits. Typically, k is equal to eight or sixteen. The set of column selection signals CS will therefore comprise $2^n/k$ signals, each associated with k columns BL. For each binary code in the n column addressing signals CADD, k columns will be selected simultaneously from the $2^n$ columns of the memory matrix 2.

The $2^n$ columns BL of the memory matrix 2, arranged in k packets each of $2^n/k$ columns, are connected to k selection circuits 5 which receive the $2^n/k$ column selection signals from the column decoding circuit 4. The selection circuits 5 are basically $2^n/k$-to-1 multiplexers and each has an output connected to a respective reading circuit sense amplifier SA for reading the data stored in the memory cells. The k outputs O1–Ok of the k reading circuits SA are supplied by respective output buffers OB to k respective output terminals I/O1–I/Ok of the integrated circuit. In a programmable, non-volatile memory, the output terminals I/O1–I/Ok are input/output terminals since they are the same terminals to which the data to be programmed into the memory cells is supplied from outside the memory.

The k outputs O1–Ok of the k reading circuits SA are also supplied as inputs to an OR gate OR1, the output of which can be connected to a terminal of the memory 1 by a further output buffer 9. The terminal to which the output of the output buffer 9 can be connected may advantageously be one of the terminals I/O1–I/Ok, such as terminal I/Ok, for example. Both the output buffers OB and the output buffer 9 are of the tristate type, that is, they can be deactivated in a manner such that their outputs can be put in a high-impedance condition.

An input buffer 12 connected to a generic terminal T2 of the memory 1 has a triggering threshold such that it switches when a voltage value at its input, that is, at the terminal T2, is higher than the normal value corresponding to a high logic level. For example, bearing in mind that the supply voltage VDD is typically 5 volts or 3 volts, the input buffer 12 may be formed in a manner such that its triggering voltage is 10 volts. The output 13 of the input buffer 12 controls the output buffers OB and the further output buffer 9 in a manner such that the latter is activated when the former are deactivated, and vice versa.

During normal operation of the memory, the driver circuits 10 of the lines WL are supplied by the voltage VDD, that is, by the supply voltage of the memory supplied via the terminal 7. The supply voltage can, however, be supplied to the driver circuits 10 directly from outside the memory 1 via a terminal generally indicated Ti thereof by a switch 11.

The terminals T1 and T2 may advantageously be two of the terminals I/O1–I/Ok, other than the terminal to which the output buffer 9 is connected. Alternatively, the terminals T1 and T2 may be two other terminals of the integrated circuit provided that they are not among those used in the testing operation. Typically, this does not include terminals 7 and 8 because the supply voltage VDD and the reference voltage GND are supplied to the integrated circuit through these terminals. This also does not include the terminals A1–Ah because the external addressing signals are supplied to the integrated circuit through these terminals. An expert in the art will easily be able to identify, according to the type of integrated circuit, which terminals to use for implementing the testing method according to the present invention and, of course, it is clearly preferable, although not absolutely essential, to make use of the terminals already provided in the integrated circuit. This avoids having to provide additional terminals.

A device 14 which can be used for testing the memory 1 is shown extremely schematically in FIG. 1. The test device 14 can supply addressing signals for addressing the locations of the memory to the terminals A1–Ah of the memory 1. The device 14 also supplies a signal 15 for activating the testing mode to the terminal T2 of the memory 1. The terminal T1 is connected to a variable-voltage generator. The device 14 is connected to the terminal I/Ok of the memory 1 to receive the output of the output buffer 9.

The memory 1 is tested in the following manner. The memory 1 is first subjected to programming all of the memory cells by the normal programming method. This brings about an increase in the threshold voltage values (i.e., a threshold shift) of the memory cells. Although all of the various cells of the memory are put in a substantially identical condition during the programming, the threshold voltage varies from cell to cell in accordance with a statistical distribution, as is readily known by one skilled in the art.

To enter the testing mode, the device 14 sets the signal 15, and hence the terminal T2 of the memory 1 at a sufficiently high voltage, such as 10 volts. This voltage value causes the buffer 12 to switch, thus activating the signal 13 which, on the one hand, deactivates the output buffers OB which are put in the high-impedance condition and, on the other hand, activates the output buffer 9 which thus connects the output of the OR gate OR1 to the terminal I/Ok of the memory 1. The switch 11 switches and connects the supply of the driver circuits 10 to the terminal T1 of the memory 1.

The device 14 accesses all of the locations of the memory 1 via the terminals A1–Ah, that is, it scans all of the possible combinations of addressing signals. For each combination of addressing signals, the test device 14 causes the voltage value applied to the terminal T1 to vary, starting from an initial low value which is definitely below the lowest threshold voltage of the programmed cells. This initial value may, for example, be 0 volts, or a higher value equal to the mean threshold voltage of the cells when they are not programmed, for example. The voltage applied to the terminal T1 may be varied continuously (a continuous ramp) or discretely (a stepped ramp). In the latter case, the size of the steps of the ramp will depend on the degree of resolution to be achieved in the measurement of the lowest threshold voltage. A suitable step size is, for example, 100 mvolts.

The line WL currently selected is brought by the respective driver circuit 10 to the voltage supplied by the test device 14 at the terminal T1. As long as the voltage supplied by the test device 14 at the terminal T1 is lower than the lowest of the threshold voltages of the memory cells belonging to the memory location currently addressed, all of the outputs O1–Ok of the reading circuits SA remain at a predetermined logic level conventionally corresponding to the reading of a programmed memory cell. For example, the predetermined logic level is a low logic level (0). The output of the OR logic gate OR1 thus remains at the low logic level and the device 14 therefore continues to detect a low logic state at the terminal I/Ok driven by the output buffer 9.

When the voltage supplied to the terminal T1 reaches the lowest of the threshold voltage values of the memory cells belonging to the location currently addressed, the output of the corresponding reading circuit SA switches and is brought to the logic level conventionally corresponding to the reading of a non-programmed memory cell. In the example described, the logic level is a high logic level (1). Since all of the outputs of the reading circuits are connected in an OR logic arrangement, the switching of only one of the signals O1–Ok to the high logic state brings about switching of the OR gate OR1, and consequently switching of the logic state at the terminal I/Ok. This switching is detected by the test device 14 which can thus infer that the voltage currently applied to the terminal T1 of the memory 1 corresponds to the lowest of the threshold voltage values of the memory cells belonging to the memory location currently addressed. This value is stored by the test device 14.

These steps are repeated for all of the memory locations of the memory 1. That is, for each memory location, the lowest of the threshold voltage values of the memory cells belonging to that location is determined in the manner described above. If the lowest value identified for the location currently addressed is lower than the lowest value which has been measured for the memory locations previously addressed and is stored in the test device 14, the test device updates the lowest value stored therein.

The lowest threshold voltage of the memory cells of the memory matrix 2 is thus determined by accessing all of the memory locations. It can easily be understood that the method according to the invention achieves a significant saving in time in comparison with the conventional method which provides for direct access to each individual memory cell, i.e., a direct memory access (DMA). In fact, bearing in mind that the matrix 2 contains $2^m \times 2^n$ memory cells which, with the DMA technique, would have to be accessed individually, it suffices, by virtue of the method according to the invention, to access $(2^m \times 2^n)/k$ memory locations.

For a memory with a parallel output capacity of k=8, the time required to identify the lowest threshold voltage value of the cells of the memory matrix is reduced to ⅛ of the time which would be required by the DMA technique. The saving in time becomes even more significant for memories with a larger parallel output capacity, for example k=16.

The method described above can advantageously be used in an operation to check the retention of data by the memory 1. In this case, after the lowest memory threshold voltage has been identified and stored, the memory is subjected to thermal stress to simulate ageing. After the thermal stressing which, typically, will have caused a reduction in the threshold voltages of the memory cells, the measurement of the lowest threshold value of the memory 1 can be performed again in the same manner as described above. The new value thus determined can be compared with the value previously stored in order to evaluate to what extent the thermal stressing, and hence the simulated ageing of the memory, has affected the ability of the memory to keep the programmed data stored.

The test method described may be performed on a silicon wafer, that is, before it is divided into individual dice.

Naturally, the use of the OR gate OR1 in the architecture shown in FIG. 1 should not be considered to be a limitation of the present invention but merely a practical implementation resulting from the fact that it has been established, purely by convention, that the logic levels of the outputs O1–Ok of the reading circuits SA are the low logic level when a programmed memory cell is read and the high logic level when a non-programmed memory cell is read, respectively.

Clearly, if the opposite convention were adopted, it would be necessary to use an AND gate instead of the OR gate OR1. In general, therefore, in order to implement the method according to the present invention, the outputs O1–Ok of the reading circuits SA will be supplied in parallel to a logic circuit with k inputs and one output which can switch the logic level at its output when at least one of the inputs is subjected to switching.

It should be noted that although, in the example described above, the lowest threshold voltage of the memory 1 which is determined by the test device 14 by accessing all of the memory locations in sequence is stored in the device 14, for example, for subsequent comparison with the new lowest threshold voltage determined by repeating the measurement after having subjected the memory to thermal stress, the lowest threshold voltage determined before the thermal stress may also be stored directly in the memory 1. For this purpose one or, in general, several locations of the memory 1 may be dedicated to the storage of the lowest threshold voltage in digital form.

In other words, once the test device 14 has identified the lowest threshold voltage of the memory 1 by the method described above, the device 14 can convert it into a digital code, for example, of k bits, and can then store the code in the location of the memory 1 dedicated to this purpose. This dedicated location should not be subjected to preliminary programming nor should it be accessed during the search for the lowest threshold voltage value.

It should also be noted that the method according to the invention and the circuit architecture for implementing it do not exclude the possibility of conventional direct access to the cells of the memory 1 being performed in accordance with the DMA technique. This capability may in any case be required to be able to perform particular characterizations of the memory cells. For example, although for simplicity, this is not indicated in FIG. 1, it is known that the techniques for reading the memory cells, and hence the respective reading circuits SA, are typically of the differential type. This is based on a comparison of the current absorbed by a memory cell currently addressed with the current absorbed by a reference memory cell which is in a known programming state and is taken as a reference. It is therefore important to be able to perform a detailed characterization of the reference memory cells.

Figure 2:
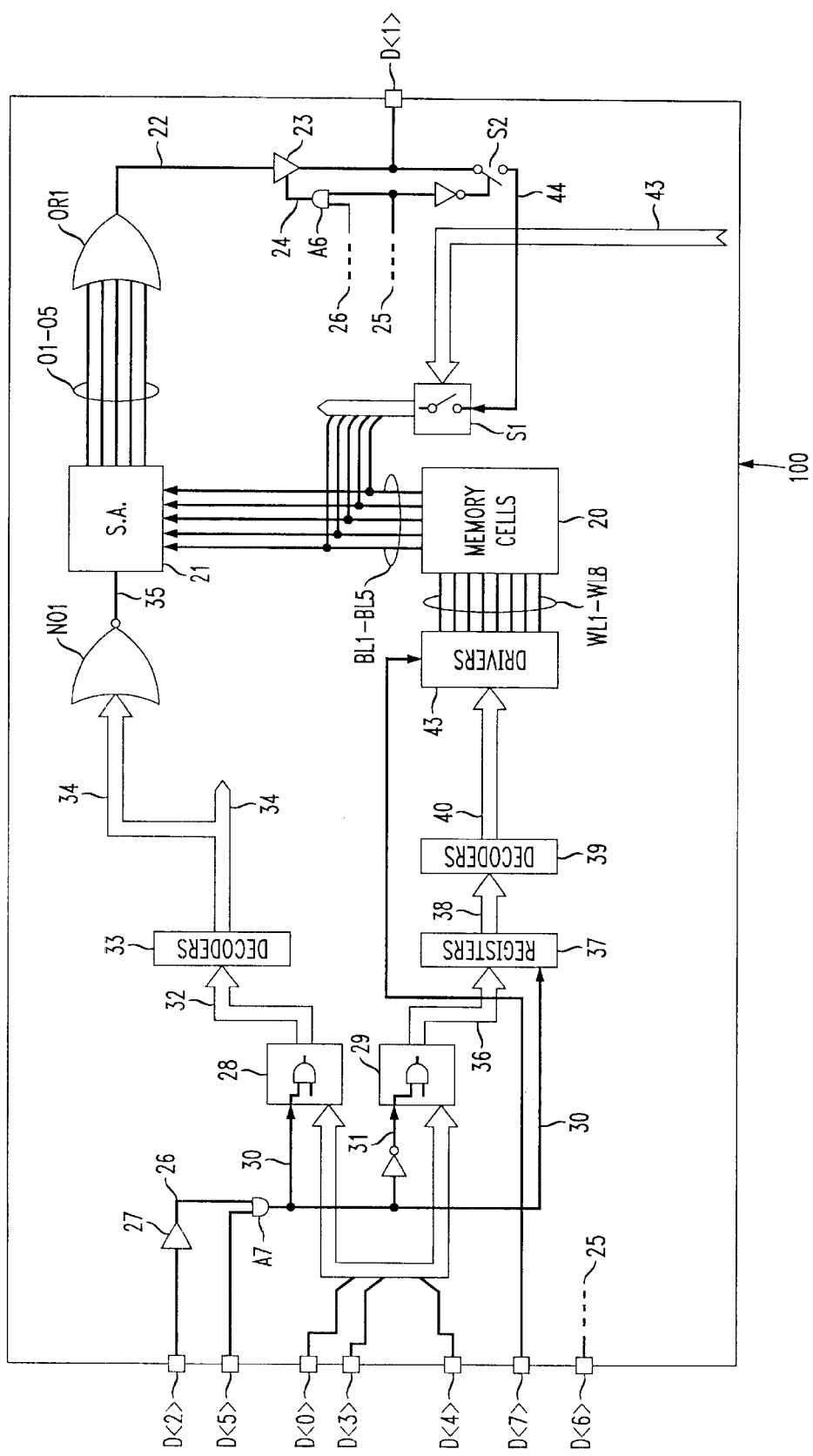
FIG. 2 shows, again schematically, a second practical embodiment of the present invention.

FIG. 2 shows schematically a memory with a circuit architecture which, as well as enabling the method of the present invention to be implemented, also permits direct access to the memory cells (DMA). The memory is, for example, of the embedded type, that is, part of a more complex circuit 100 integrated in a single semiconductor chip.

The memory comprises a matrix of memory cells 20 comprising eight lines (word lines) WL1–WL8 and five columns (bit lines) BL1–BL5, for a total of eight five-bit memory locations. The bit lines BL1–BL5 are connected to respective reading circuits (sense amplifiers), one for each bit line, shown schematically as a single block 21. The five outputs O1–O5 of the five sense amplifiers of the block 21 are supplied to an OR gate OR1 with five inputs, which is equivalent to the OR gate OR1 with k inputs of FIG. 1. The output 22 of the OR gate OR1 is supplied by an output buffer 23 which can be activated selectively to a terminal D<1> accessible from outside the integrated circuit 100. The output buffer 23 is equivalent to the output buffer 9 of FIG. 1.

The output buffer 23 is enabled by a signal 24 output by an AND gate A6 which receives a signal 25 and a signal 26 as inputs. The signal 25 comes from a terminal D<6> accessible from outside the integrated circuit 100. The signal 26 is an output signal of an input buffer 27, which is similar to the buffer 12 of FIG. 1. This input buffer 27 has a high triggering threshold and its input is connected to a terminal D<2> accessible from outside the integrated circuit 100. Activation of the signal 24 causes the output buffer 23, which is normally kept in a high output-impedance condition, to be enabled. When the output buffer 23 is enabled, the signal 22 is supplied to the terminal D<1>.

Signals coming from three terminals D<0>, D<3> and D<4> accessible from outside the integrated circuit 100 are supplied to respective first inputs of a first set of three AND gates 28 each having two inputs, and to respective first inputs of a second set of three AND gates 29 each having two inputs. The three AND gates of the first set 28 receive, at their respective second inputs, a signal 30 output by a two-input AND gate A7 which receives, as inputs, the signal 26 and a signal coming from a terminal D<5> accessible from outside the integrated circuit 100. The three AND gates of the second set 29 receive at their respective second inputs a signal 31 which is the logic complement of the signal 30.

Outputs 32 of the AND gates of the first set 28 are supplied to a decoder 33. Outputs 34 of the decoder 33 are supplied to a NOR gate NO1, the output 35 of which forms an enabling signal for the sense amplifiers of the block 21. Outputs 36 of the three AND gates of the second set 29 are supplied to a bank 37 of three transparent registers, to the enabling data freezing inputs of which the signal 30 is supplied. The outputs of the three registers of the bank 37 form signals 38 which are supplied to a decoder 39.

Outputs 40 of the decoder 39 which form signals for selecting the lines WL1–WL8 of the matrix 20, are supplied to a bank 43 of driver circuits for the lines WL1–WL8. This is equivalent to the block 10 of FIG. 1. The supply voltage for the driver circuits of the bank 43 is supplied from outside the integrated circuit 100 via a terminal D<7>. The voltage applied to the line selected can thus be varied from outside the integrated circuit independently of the supply voltage of the integrated circuit.

The signals 34 output by the decoder 33 are also supplied to respective switches, generally indicated as S1. Each of the switches S1 can be activated selectively by the respective signal of the set of signals 34 to selectively connect a signal 44 to a respective one of the bit lines BL1–BL5. The signal 44 can be connected selectively by a switch S2 to the terminal D<l> which is accessible from outside the integrated circuit 100. The switch S2 is controlled by a logic complement of the signal 25.

First of all, the circuit architecture described enables the lowest threshold voltage to be found as described with reference to FIG. 1. For this purpose, after all of the cells of the matrix 20 have been programmed, a test device, not shown, but exactly the same as that shown schematically in FIG. 1, applies to the terminal D<2> of the integrated circuit 100 a voltage of suitably high value, for example 10 volts, so that the buffer 27 is triggered and activates the signal 26. A voltage corresponding to the high logic level is applied to the terminal D<6> which is accessible from outside the integrated circuit 100 so that the signal 25 is activated and, when the output 24 of the AND gate A6 is activated, it enables the output buffer 23.

The output 22 of the OR gate OR1 is thus connected to the terminal D<1> of the integrated circuit 100. A voltage corresponding to the low logic level is applied to the terminal D<5> so that the set of AND gates 28 is disabled but the set of AND gates 29 is enabled. The signals applied to the terminals D<0>, D<3> and D<4> of the integrated circuit thus reach the decoding circuit 39 passing through the AND gates 29 and the bank of transparent registers 37. The decoding circuit 39 activates one of the signals 40 based upon the particular combination of logic values present in the signals 38.

The activated signal of the set 40 reaches the respective driver circuit 43, thus selecting the respective line WL1–WL8. If the voltage applied to the terminal D<7> is increased from an initial low level as soon as one of the outputs O1–O5 of the reading circuits 21 switches. The change from the low logic state to the high logic state causes the output 22 of the OR gate OR1 to switch. The test apparatus can infer by detecting the transition at the terminal D<1> that the value of the voltage applied to the terminal D<7> at the time in question corresponds to the lowest threshold voltage of the cells belonging to the memory location selected. By repeating the same steps for all of the memory locations, that is, by varying the combination of logic states applied to the terminals D<0>, D<3> and D<4>, so as to scan all of the memory locations, it is possible to determine the lowest threshold voltage of the matrix 20. The initial low level is definitely below the lowest threshold voltage of the programmed cells and, for example, is equal to the mean threshold voltage of the cells when they are not programmed.

If, however, a particular memory cell of the matrix 20 is to be accessed directly in the DMA mode, the following method is used. A high voltage is again applied to the terminal D<2> to trigger the buffer 27 so as to activate the signal 26. This puts the memory in a test mode. A voltage corresponding to the low logic level is applied to the terminal D<6> so that the AND gate A6 is disabled by the signal 25, and the output buffer 23 is set in the high output-impedance condition. The output 22 of the OR gate OR1 is therefore disconnected from the terminal D<1>. At the same time, the switch S2 is closed so as to connect the signal 44 to the terminal D<1> of the integrated circuit 100.

Initially, a voltage corresponding to the low logic level is applied to the terminal D<5> so as to disable the AND gates 28 and to enable the AND gates 29. By applying the desired combination of logic values to the terminals D<0>, D<3> and D<4>, it is thus possible to select by the decoding circuit 39 the line WL1–WL8 containing the memory cell to be accessed. The voltage applied to the terminal D<5> is then brought to a value corresponding to the high logic level. The combination of logic states currently applied to the terminals D<0>, D<3> and D<4> is thus frozen in the registers of the bank 37 making these terminals available for the selection of one of the bit lines BL1–BL5, the AND gates 29 are disabled, and the AND gates 28 are enabled.

By applying a particular combination of logic states to the terminals D<0>, D<3>, D<4> in accordance with a preselected code, it is therefore possible to activate one of the signals 34 by the decoder 33, closing the respective switch S1 so as to connect the desired bit line BL1–BL5 to the signal 44, and hence to the terminal D<1>. The activation of one of the signals 34 also brings about activation of the signal 35 which disables the sense amplifiers 21. It is thus possible, by varying the voltage applied to the terminal D<7>, to measure by an ammeter connected to the terminal D<1> the current absorbed by the memory cell belonging to the word line and to the bit line selected. This bypasses the sense amplifiers.

Clearly, in this second embodiment of the present invention, it is also possible to make use of one or more memory locations for the storage of the lowest threshold voltage of the memory matrix 20 determined in the manner described above. This may, for example, be useful to perform a comparison with the lowest threshold voltage measured after the integrated circuit 100 has been subjected to thermal stress. The memory location or locations intended for storing the lowest threshold voltage measured should not be subjected to preliminary programming or to scanning during the check.

With regard to the capability for direct access to the memory cells, clearly, with an arrangement similar to that shown in FIG. 2, it is possible to access directly the reference memory cells used as reference cells by the sense amplifiers for comparison with the memory cells of the matrix which are to be read.

Naturally, further variations and/or additions may be applied to the embodiments described above and illustrated, without thereby departing from the scope of protection of the invention defined by the appended claims.

That which is claimed is:

1. A method for testing a programmable, non-volatile memory comprising a matrix of memory cells, the method comprising:

programming a plurality of the memory cells; and
   addressing, in succession, the programmed memory cells to identify a lowest of threshold voltage levels, the addressing for each memory location comprising
   a) applying a selection voltage that is lower than the lowest threshold voltage level to a word line of the matrix of memory cells corresponding to a memory location currently being addressed,
   b) reading bits from the programmed memory cells of the memory location currently being addressed,
   c) repeating step b) while progressively changing the selection voltage supplied to the word line corresponding to the memory location currently being addressed until it is detected that at least one of the bits of the memory location currently being addressed has switched from a first logic level corresponding to a reading of a programmed memory cell to a second logic level corresponding to a reading of a non-programmed memory cell, the selection voltage for which the switching is detected being the low threshold voltage level of the threshold voltages of the programmed memory cells in the memory location currently being addressed,
   d) comparing the low threshold voltage level in the memory location currently being addressed as determined in step c) with a stored value corresponding to the lowest of the low threshold voltages of the memory locations previously addressed, and
   e) storing the lowest threshold voltage level of the memory location currently being addressed if it is lower than a stored value.

2. A method according to claim 1, wherein the selection voltage is increased in accordance with a voltage ramp.

3. A method according to claim 2, wherein the voltage ramp is a stepped ramp.

4. A method according to claim 1, wherein step b) for reading is performed using reading circuits connected to the matrix of memory cells; and wherein step c), to detect the switching of at least one of the bits of the memory location currently being addressed, output signals from the reading circuits are supplied to a logic circuit for switching a respective output signal when at least one of the output signals of the reading circuits switches from the first logic level to the second logic level, the logic state of the output signal of the logic circuit being monitored to detect the switching.

5. A method according to claim 4, wherein the logic circuit performs a logic OR operation on the output signals from the reading circuits.

6. A method according to claim 4, wherein the logic circuit performs a logic AND operation on the output signals from the reading circuits.

7. A method according to claim 4, wherein the memory includes a first externally accessible terminal and a second externally accessible terminal; wherein the selection voltage is supplied by an external test device to the first externally accessible terminal, and the respective output signal is supplied to the second externally accessible terminal for monitoring by the test device.

8. A method according to claim 7, wherein the test device uses terminals of the memory which are provided for the normal operation thereof.

9. A method according to claim 1, wherein the memory comprises a stand-alone memory.

10. A method according to claim 1, wherein the memory comprises an embedded memory.

11. A method for testing a programmable, non-volatile memory comprising a matrix of memory cells, the method comprising:

programming a plurality of the memory cells;

determining a lowest threshold voltage level of threshold voltages of the programmed memory cells by addressing, in succession, the programmed cells to identify a lowest of the threshold voltage levels, the addressing for each memory location comprising
  a) applying a selection voltage that is lower than the lowest threshold voltage level to a word line of the matrix of memory cells corresponding to a memory location currently being addressed,
  b) reading bits from the programmed memory cells of the memory location currently being addressed,
  c) repeating step b) while progressively changing the selection voltage supplied to the word line corresponding to the memory location currently being addressed until it is detected that at least one of the bits of the memory location currently being addressed has switched from a first logic level corresponding to a reading of a programmed memory cell to a second logic level corresponding to a reading of a non-programmed memory cell, the selection voltage for which the switching is detected being the low threshold voltage level of the threshold voltages of the programmed memory cells in the memory location currently being addressed,
  d) comparing the lowest threshold voltage level in the memory location currently being addressed as determined in step c) with a stored value corresponding to the lowest of the low threshold voltages of the memory locations previously addressed, and
  e) storing the lowest threshold voltage level of the memory location currently being addressed if it is lower than a stored value; subjecting the memory to premature ageing; determining a new lowest threshold voltage level of the threshold voltages of the programmed memory cells after the premature ageing by repeating step a) through e); and comparing the new lowest threshold voltage level determined after the premature ageing with the lowest threshold voltage determined before the premature ageing to establish the ability of the memory to retain data.

12. A method according to claim 11, wherein the lowest threshold voltage determined before the premature ageing is stored in the matrix of memory cells for subsequent comparison with the new lowest threshold voltage determined after the premature ageing.

13. A method according to claim 12, wherein storing the lowest threshold voltage determined before the premature ageing, use is made of at least one of the memory locations in the matrix of memory cells which are not subjected to programming and are not addressed by steps a) through e).

14. A method according to claims 11, wherein subjecting the memory to premature ageing comprises a thermal stress.

15. A method according to claim 11, wherein the selection voltage is increased in accordance with a voltage ramp.

16. A method according to claim 11, wherein the voltage ramp is a stepped ramp.

17. A method according to claim 11, wherein step b) for reading is performed using reading circuits connected to the matrix of memory cells; and wherein step c), to detect the switching of at least one of the bits of the memory location currently being addressed, output signals from the reading circuits are supplied to a logic circuit for switching a respective output signal when at least one of the output signals of the reading circuits switches from the first logic level to the second logic level, the logic state of the output signal of the logic circuit being monitored to detect the switching.

18. A method according to claim 17, wherein the logic circuit performs a logic OR operation on the output signals from the reading circuits.

19. A method according to claim 17, wherein the logic circuit performs a logic AND operation on the output signals from the reading circuits.

20. A method according to claim 17, wherein the memory includes a first externally accessible terminal and a second externally accessible terminal; wherein the selection voltage is supplied by an external test device to the first externally accessible terminal, and the respective output signal is supplied to the second externally accessible terminal for monitoring by the test device.

21. A method according to claim 11, wherein the external test device uses terminals of the memory which are provided for the normal operation thereof.

22. A method according to claim 11, wherein the memory comprises a stand-alone memory.

23. A method according to claim 11, wherein the memory comprises an embedded memory.

24. An integrated circuit comprising:

a matrix of programmable, non-volatile memory cells;

a plurality of word lines connected to said matrix of memory cells;

a plurality of reading circuits for reading, in parallel, memory cells belonging to a memory location currently being addressed;

a logic circuit having inputs for receiving outputs from said plurality of reading circuits, said logic circuit for switching its own output when at least one of the outputs from said plurality of reading circuits switches from a first logic level corresponding to a reading of a programmed memory cell to a second logic level corresponding to a non-programmed memory cell;

a first externally accessible terminal; and an output circuit for selectively connecting an output of said logic circuit to said first externally accessible terminal for connecting to an external test device.

25. An integrated circuit according to claim 24, wherein said logic circuit comprises a logic OR gate.

26. An integrated circuit according to claim 24, wherein said logic circuit comprises a logic AND gate.

27. An integrated circuit according to claim 24, wherein said output circuit comprises a tristate output driver circuit.

28. An integrated circuit according to claim 24, further comprising a second externally accessible terminal; and wherein said output circuit is activated by setting the integrated circuit in a checking mode by applying to said second externally accessible terminal a voltage having a value outside a range of threshold voltage values that can be applied to said second externally accessible terminal during normal operation of said matrix of memory cells.

29. An integrated circuit comprising:

a matrix of programmable, non-volatile memory cells;

a plurality of word lines connected to said matrix of memory cells;

a plurality of reading circuits for reading, in parallel, memory cells belonging to a memory location currently being addressed;

a logic circuit having inputs for receiving outputs from said plurality of reading circuits, said logic circuit for switching its own output when at least one of the outputs from said plurality of reading circuits switches from a first logic level corresponding to a reading of a programmed memory cell to a second logic level corresponding to a non-programmed memory cell;

a first externally accessible terminal;

a second externally accessible terminal; and circuit means for selectively connecting an output of said logic circuit to said first externally accessible terminal for connecting to an external test device, said circuit means being activated by setting the integrated circuit in a checking mode by applying a voltage to said second externally accessible terminal.

30. An integrated circuit according to claim 29, wherein said logic circuit comprises a logic OR gate.

31. An integrated circuit according to claim 29, wherein said logic circuit comprises a logic AND gate.

32. An integrated circuit according to claim 29, wherein said circuit means comprises a tristate output driver circuit.

33. An integrated circuit according to claim 29, wherein the voltage applied to said second externally accessible terminal has a value outside a range of threshold voltage values that can be applied to said second externally accessible terminal during normal operation of said matrix of memory cells.

* * * * *